United States Patent
Kirkpatrick (10) Patent No.: US 11,101,134 B2
(45) Date of Patent: Aug. 24, 2021

(54) METHOD AND APPARATUS TO ELIMINATE CONTAMINANT PARTICLES FROM AN ACCELERATED NEUTRAL ATOM BEAM AND THEREBY PROTECT A BEAM TARGET

(71) Applicant: Exogenesis Corporation, Billerica, MA (US)

(72) Inventor: Allen R. Kirkpatrick, Carlisle, MA (US)

(73) Assignee: Exogenesis Corporation, Billerica, MA (US)

( * ) Notice: Subject to any disclaimer, the term of this patent is extended or adjusted under 35 U.S.C. 154(b) by 0 days.

(21) Appl. No.: 16/566,649

(22) Filed: Sep. 10, 2019

(65) Prior Publication Data

US 2020/0083048 A1 Mar. 12, 2020

Related U.S. Application Data (60) Provisional application No. 62/729,162, filed on Sep. 10, 2018.

(51) Int. Cl.
*H01L 21/263* (2006.01)
*H01J 37/147* (2006.01)
*H01J 37/305* (2006.01)

(52) U.S. Cl.
CPC ...... *H01L 21/2633* (2013.01); *H01J 37/1472* (2013.01); *H01J 37/3053* (2013.01); *H01J 2237/022* (2013.01); *H01J 2237/0473* (2013.01); *H01J 2237/082* (2013.01)

(58) Field of Classification Search
None
See application file for complete search history.

(56) References Cited

U.S. PATENT DOCUMENTS

| | | | | |
|---|---|---|---|---|
| 3,387,174 A | * | 6/1968 | Post | G21K 1/14 315/111.01 |
| 2004/0227105 A1 | * | 11/2004 | Benveniste | H01J 37/05 250/492.21 |
| 2006/0097197 A1 | * | 5/2006 | Sakaguchi | H01J 37/12 250/492.21 |
| 2006/0113494 A1 | | 6/2006 | Chen et al. | |
| 2008/0149846 A1 | * | 6/2008 | Platzgummer | B82Y 10/00 250/398 |
| 2010/0193472 A1 | | 8/2010 | Tabat et al. | |
| 2016/0172197 A1 | | 6/2016 | Kirkpatrick et al. | |

OTHER PUBLICATIONS

International Search Report and Written Opinion issued in PCT/US2019/050450, dated Jan. 9, 2020.

* cited by examiner

*Primary Examiner* — Shamim Ahmed
(74) *Attorney, Agent, or Firm* — Burns & Levinson LLP; Jerry Cohen (57) ABSTRACT

An improved ANAB system or process substantially or fully eliminating contaminant particles from reaching a beam target by adding to the usual primary (first) ionizer of the ANAB system or process an additional (second) ionizer to ionize contaminant particles and means to block or retard the ionized particles to prevent their reaching the beam target.

3 Claims, 11 Drawing Sheets

METHOD AND APPARATUS TO ELIMINATE CONTAMINANT PARTICLES FROM AN ACCELERATED NEUTRAL ATOM BEAM AND THEREBY PROTECT A BEAM TARGET

CROSS REFERENCE TO RELATED APPLICATIONS

This application claims priority from U.S. Provisional Patent Application Ser. No. 62/729,162, filed Sep. 10, 2018 and incorporated herein by reference in its entirety.

FIELD OF THE INVENTION

The present invention relates to improved methods and apparatus for neutral beam processing using neutral beams derived from gas cluster ion beams and limiting particle contamination therein.

BACKGROUND OF THE INVENTION

In the Accelerated Neutral Atom Beam (ANAB) technique, which is conducted within a chamber or chambers under high vacuum conditions, a directional beam of electrically neutral energetic individual gas atoms is created by forming gas clusters, ionizing the clusters, accelerating them through a high voltage, causing the cluster ions to release many of their energetic constituent atoms, and then employing electrostatic deflection to remove residual charged species from the beam. Typical energies of the ANAB neutral atoms are of the order of a few to a few tens of electron volts, an ideal range for producing many shallow processing actions on material surfaces. Such actions are useful for various processes that are needed in the manufacturing of many products including, among others, present and future generations of semiconductor devices, optical devices, optoelectronic devices and MEMs structures.

For many applications, it is essential that the process itself must not result in the addition of contaminating particles onto the surfaces of the substrates being treated. This is particularly critical in the case of semiconductor wafers where, in order for a process to be acceptable for device manufacturing, it is generally demanded that essentially zero particles of sizes of 30 nm or larger in diameter be added to the substrate wafer surface.

In an ANAB apparatus and method, a beam consisting of only individual energetic electrically neutral atoms is to be delivered to a substrate being processed. An electrostatic deflector, which is a fundamental component of the ANAB system, diverts charged species, primarily monomer ions and ionized gas cluster fragments, from the processing beam. Vacuum chamber walls and component surfaces within the ANAB apparatus are continuously bombarded by the deflected charged species, and also by other ions emerging from the ANAB source with trajectories that do not carry them through the deflector. These energetic ion species cause sputtering of atoms from the surfaces on which they impact. Deposits form on surfaces within the apparatus due to accumulation of the sputtered atoms. Particles are then created when portions of accumulated deposits are ejected by actions such as plasma discharges or local built up charge flashovers. Some of these particles find paths to substrates being processed. It is known that the primary electrostatic deflector of the ANAB system is effective in removing charged particles which pass through it. However, particles are not necessarily charged, and particles that are charged can still have paths to a substrate in process without passing through the primary deflector. Addition of particles onto a substrate during processing by ANAB is unacceptable for many applications, particularly those for semiconductors. At present, the particles of greatest concern are those which are 30 nm or greater in diameter, at least in part because inspection equipment capable of observing even smaller particles is generally not available. A 30 nm diameter particle is comprised of a few million atoms.

An object of the present invention is to provide a filter to prevent contaminating particles from an ANAB apparatus from reaching an object being processed with the ANAB beam.

Another object of the invention is to provide such a filter which creates the only path for all particles moving toward an object being processed.

Yet another object of the present invention is to provide such a filter that uses an ionizer which only ionizes particles larger than and/or slower than the accelerated, neutral monomers of an ANAB beam.

Still another object of the invention is to provide a filter that uses a second ionizer which does not affect operation of a primary ionizer in the ANAB system.

SUMMARY OF THE INVENTION

The present invention provides an apparatus and method to prevent contaminating particles from reaching the substrate. The apparatus comprising an additional ionizer (referred to as a "second ionizer" as opposed to the previous first (primary) ionizer of the ANAB system) plus ion deflection or ion blocking electrodes. An assembly of the second ionizer and blocking or deflecting electrodes is positioned on the system beamline such that the only path to the substrate is through it. Any particle travelling toward the substrate becomes electrically charged as it passes through the second ionizer and it is then prevented by the blocking electrode or deflector from continuing to move to the substrate. The assembly has negligible influence upon the ANAB accelerated neutral atoms themselves because their high velocities and low cross sections for ionization result in very low probabilities of ionization.

The present invention is intended to prevent any particles 30 nm or larger in diameter from being added to substrates during ANAB processing. It will also be effective for eliminating even smaller particles.

A large number of potential sources for particle generation exist within the vacuum chambers of an ANAB system. These include the surfaces of components of the ANAB source, the system electrodes, structural support components and the vacuum chamber walls. Energetic ions present within the ANAB system sputter atoms from surfaces upon which they impact. Deposits of sputtered atoms accumulate on various surfaces throughout the system and particles are then created when plasmas or local electrical discharges cause ejection of minute portions of these deposits. Particles which originate within the primary ionizer of the ANAB system and which become ionized and accelerated together with the neutral beam atoms are automatically deflected out of the beam by the ANAB primary deflector if they pass into it. A method is needed to eliminate all other particles.

One method of eliminating contaminant particles from an ANAB system to incorporate a particle elimination assembly on the ANAB beamline in a configuration such that passage through it represents the only possible path for particles to reach an article being processed. The particle elimination assembly must prevent transport of particles to the substrate without interfering with the ANAB atoms.

Efficiency of ionization of ANAB atoms within the second ionizer is very close to zero because of the high velocity of the energetic neutral monomers as they pass through an ionizing electron shower. This characteristic is recognized and used to advantage by using an ionizer to ionize particles substantially larger than monomers while not interfering with the flow of neutral monomers.

This approach to keeping particles from getting to the wafer is particularly suitable for the ANAB neutral beam and it will not work for a Gas Cluster ion Beam (GCIB) or for any other conventional ion beam technique. What is referred to above as a second ionization unit or second ionization process step might be a first or sole ionization unit or step in such alternative usages. This can be applied to a beam of neutral monomers having contaminant particles therein of at least one order of magnitude size (OOM) differences vs. the neutral beam monomers and/or a neutral beam with velocity of its monomers at least one OOMs faster than velocity of contaminant particles therein (preferably more than one OOM difference as to one such parameter or as to both of such parameters). Such a beam is exposed in a zone that the beam transits to ionizing radiation for ionizing the contaminant particles which can then be electrostatically deflected or blocked while the neutral monomers are not ionized significantly because of their greater velocity passing through the ionization zone and/or smaller size compared to contaminant particles.

One embodiment of the present invention provides a method of ANAB processing of target substrate surfaces, the improvement comprising providing a contaminant particle elimination step in an ANAB process of deriving a neutral beam comprising energetic monomers from a GCIB, which has been subjected to a primary (first) ionization step and accelerated under conditions subject to entraining contaminant particles in the neutral beam and providing an assembly for deflecting or blocking contaminant particles therein, if any, such that no paths of the neutral beam to the target substrate surface to be processed exist other than through the assembly.

The step of deflecting or blocking may include a secondary electron ionization step which is implemented without detrimentally influencing the primary ionization by employing positive offset voltages and a surrounding ground screen to prevent electrons from escaping. A retarding field may be employed in the assembly to block ionized particles from travelling to the target substrate surface. An electrostatic deflector may be employed in the assembly to remove ionized particles from the path to the target substrate surface.

Another embodiment of the invention provides a method of processing a substrate target surface for one or more of etching, smoothing planarization or other modification of the substrate target surface, comprising the steps of: (a) forming gas cluster ions by a primary (first) ionization step in a reduced pressure ambient in a chamber, (b) accelerating the gas cluster ions to form an accelerated gas cluster ion beam (GCIB) along a beam path within the chamber, (c) promoting fragmentation and/or disassociation of at least a portion of the gas clusters along the beam path toward a substrate to be processed, (d) removing charged particles from the beam path to form an accelerated neutral beam, and (e) providing an assembly for deflecting or blocking contaminant particles such that no paths to a substrate to be processed exist other than through the assembly.

The step of deflecting or blocking may include a secondary electron ionization step which is operated without detrimentally influencing the primary ionization by employing positive offset voltages and a surrounding ground screen to prevent electrons from escaping. A retarding field may be employed in the assembly to block ionized particles from travelling to the target substrate surface. An electrostatic deflector is employed in the assembly to remove ionized particles from the path to the target substrate surface.

Yet another embodiment of the invention provides a method of controlling the flow path of a beam of desired neutral monomer particles with contaminant neutral particles therein, with said two types of particles differing by at least one order of magnitude of speed and/or of size, by providing an ionization condition in the flow path that substantially ionizes the contaminant neutral particles of larger size and/or slower speed, and substantially fails to ionize desired neutral monomer particles of smaller size and/or higher speed than the desired particles of the neutral beam and providing a deflection or retarding step to enable separation of the ionized contaminant particles from the un-ionized neutral particles.

Still another embodiment of the invention provides an ANAB apparatus for treating a target substrate surface by neutral monomer beams comprising: a contaminant particle elimination assembly positioned in an ANAB system wherein generates a gas cluster ion beam with a primary ionizer and acceleration and means to direct the accelerated beam on a path to the target substrate surface, the assembly being within or affecting the beam path such that no paths exist to the target substrate surface other than through the assembly, the assembly being constructed and arranged to eliminate the contaminant particles.

The apparatus may comprise a secondary electron impact ionizer in the assembly constructed and arranged to ionize contaminant particles in the beam without detrimentally influencing the primary ionization by employing positive offset voltages and a surrounding ground screen to prevent electrons from escaping. The apparatus may comprise means for providing a retarding field to block ionized particles from travelling to the target substrate surface. The apparatus may comprise an electrostatic deflector to remove ionized particles from the path to the target substrate surface.

A further embodiment of the invention provides an apparatus for processing a substrate target surface for one or more of etching, smoothing, planarization or other modification of the substrate target surface, comprising: (a) means for forming gas cluster ions by a primary ionization means in a reduced pressure ambient in a chamber, (b) means for accelerating the gas cluster ions to form an accelerated gas cluster ion beam (GCIB) along a beam path within the chamber, (c) means for promoting fragmentation and/or disassociation of at least a portion of the gas clusters along the beam path to provide a first beam portion of energetic neutral monomers and a second beam portion of charged particles, (d) removing the charged particle second beam portion from the beam path to form an accelerated neutral beam and allowing the accelerated neutral beam to travel toward the substrate target surface to be processed, and (e) an assembly for implementing a step of ionizing contaminant particles in the accelerated neutral beam, if any, of larger size than the monomers and/or of lower velocity than the monomers such that the contaminant particles are ionized and further for deflecting or blocking the ionized contaminant particles, if any, in the accelerated neutral beam such that no paths for the beam to the substrate target surface to be processed exist other than through the assembly.

The assembly may include a secondary electron ionization means which is operated without detrimentally influencing the primary ionization means by employing positive offset voltages and a surrounding ground screen to prevent electrons from escaping. The apparatus may further comprise means in the assembly for creating a retarding field constructed and arranged to block ionized contaminant particles from travelling to the target substrate. The apparatus may further comprise means in the assembly for creating an electrostatic deflection to remove ionized contaminant particles from the path to the target substrate surface.

Other aspects, features and advantages that the invention will be clear from the following description of embodiments thereof in combination with the accompanying drawing figures.

DETAILED DESCRIPTION OF EMBODIMENTS OF THE INVENTION

Figure 1:
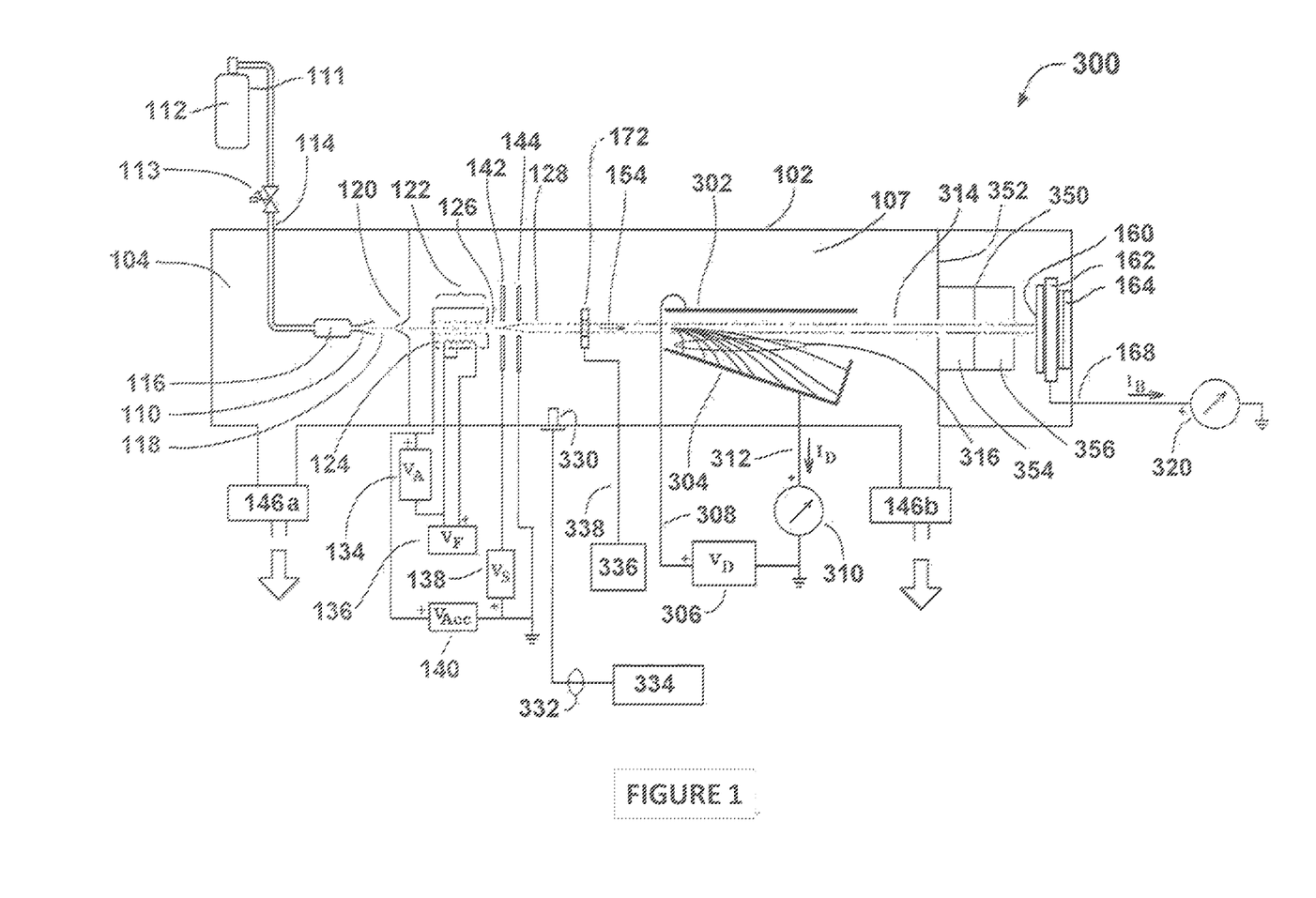
FIG. 1 is a schematic illustration according to one embodiment of the present invention as a manner of locating a particle elimination assembly within art ANAB system.

FIG. 1 illustrates the concept of how a particle elimination assembly 350 can be located within an ANAB system 300 in order to prevent particles which may be present within the apparatus from reaching a substrate 160 being processed. The particle elimination assembly 350 is shown as a path limiter 352, an ionizer 354 and a deflector or blocker 356. Details of the ionizer 354 and deflector or blocker 356 are discussed in further detail in reference to FIGS. 2A and 2B. The particle elimination assembly 350 should preferably be the last system element before the neutral beam impinges upon the substrate 161) or other target to be ANAB processed, e.g., for etching, smoothing, cleaning or doping. With the particle elimination assembly 350 in place, the only path from the source chamber of the ANAB system to the substrate should be through the particle elimination assembly 350. The actual configuration to be utilized will depend upon the details of the ANAB apparatus in the vicinity of the substrate 160.

Figure 2A:
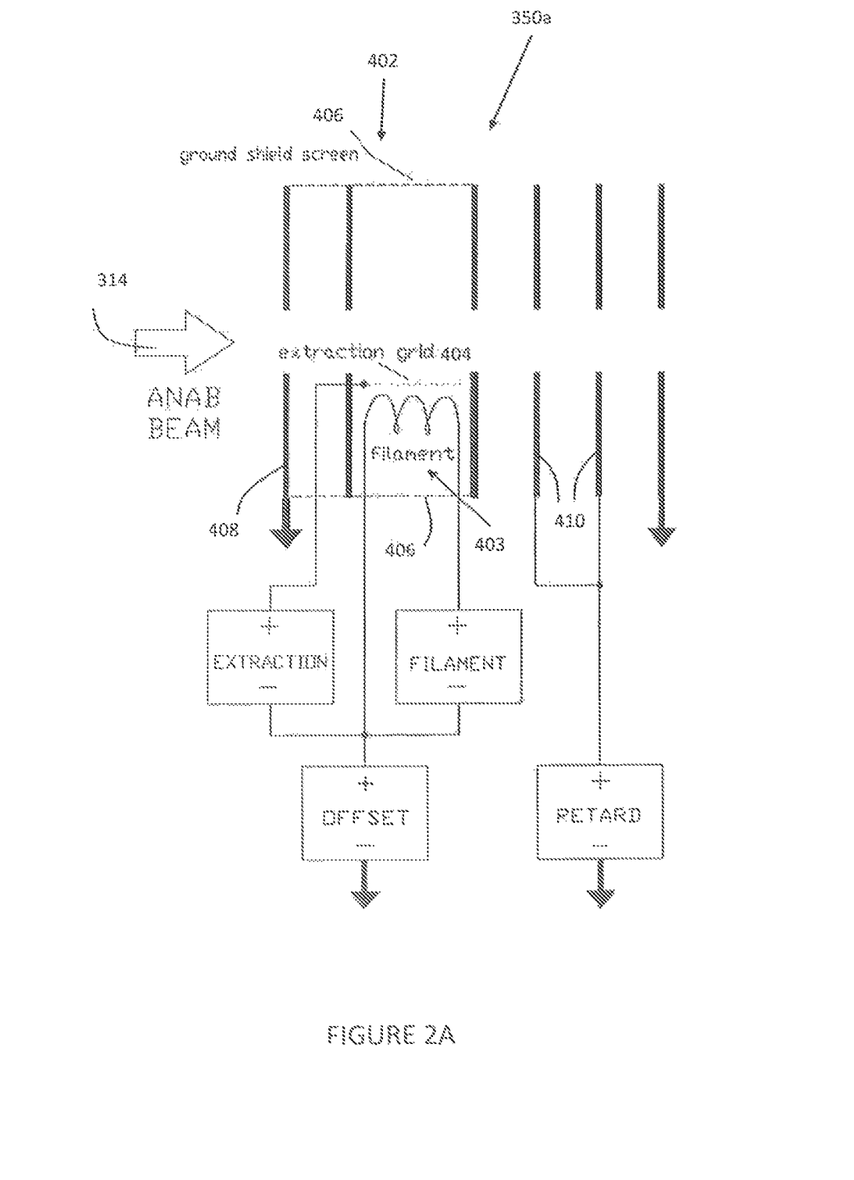
FIG. 2A shows schematically representative basic configuration for the particle elimination assembly according to another embodiment of the present invention and including an ionizer plus retarding field electrode.
Figure 2B:
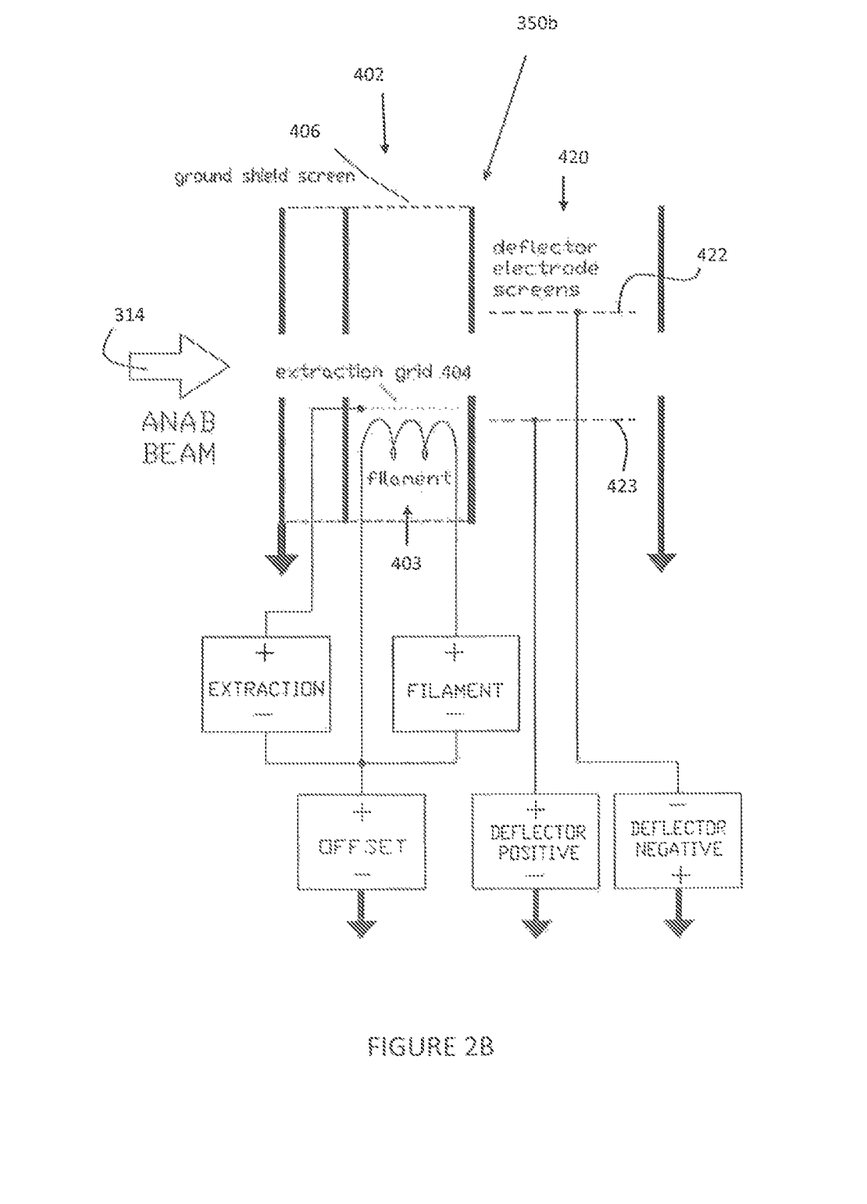
FIG. 2B shows schematically representative basic configuration for the particle elimination assembly according to another embodiment of the present invention and including an ionizer plus deflecting electrodes.

FIGS. 2A and 2B show representative basic configurations for the particle elimination assembly 350a, 350b, respectively. Each assembly 350a, 350b includes a second ionizer 354, which is in addition to the ionizer 122 already used in the GCIB apparatus. Ionizer 354 is capable of imparting electrical charge or charges onto any particle 30 nm or more in diameter which enters into it. Each particle elimination assembly 350a, 350b also includes an electrostatic field deflector or blocker 356 to either block charged species from proceeding on the neutral beam path (FIG. 2A) or to deflect charged species from the neutral beam path (FIG. 2B).

FIG. 1 is a schematic of a Neutral Beam processing apparatus 300, according to an embodiment of the invention, including a particle elimination assembly 350. Apparatus first creates an accelerated gas cluster ion beam (GCIB) 128 and then dissociates the clusters and electrostatically removes charged particles to create a Neutral Beam 314. A beamline chamber 107 encloses the ionizer 122 and accelerator regions and the workpiece processing regions. The beamline chamber 107 has high conductance and so the pressure is substantially uniform throughout. A vacuum pump 146b evacuates the beamline chamber 107. Gas flows into the beamline chamber 107 in the form of clustered and unclustered gas transported by the gas jet 118 and in the form of additional unclustered gas that leaks through the gas skimmer aperture 120. A pressure sensor 330 transmits pressure data from the beamline chamber 107 through an electrical cable 332 to a pressure sensor controller 334, which measures and displays pressure in the beamline chamber 107. The pressure in the beamline chamber 107 depends on the balance of gas flow into the beamline chamber 107 and the pumping speed of the vacuum pump 146b. By selection of the diameter of the gas skimmer aperture 120, the flow of source gas 112 through the nozzle 110, and the pumping speed of the vacuum pump 146b, the pressure in the beamline chamber 107 equilibrates at a pressure, $P_B$, determined by design and by nozzle flow. The GCIB flight path from grounded electrode 144 to workpiece holder 162, is for example, 100 cm. By design and adjustment $P_B$ may be approximately $6 \times 10^{-5}$ torr ($8 \times 10^{-3}$ pascal). Thus the product of pressure and beam path length is approximately $6 \times 10^{-3}$ torr-cm (0.8 pascal-cm) and the gas target thickness for the beam is approximately $1.94 \times 10^{14}$ gas molecules per $cm^2$, which combined with monomer evolution due to the initial ionization of the gas clusters in the ionizer 122 and collisions that occur between gas cluster ions in the GCIB 128 is observed to be effective for dissociating the gas cluster ions in the GCIB 128 and results in a fully dissociated accelerated Neutral Beam 314. $V_{Acc}$ may be for example 30 kV and the GCIB 128 is accelerated by that potential. A pair of deflection plates (302 and 304) is disposed about the axis 154 of the GCIB 128. A deflector power supply 306 provides a positive deflection voltage $V_D$ to deflection plate 302 via electrical lead 308. Deflection plate 304 is connected to electrical ground by electrical lead 312 and through current sensor/display 310. Deflector power supply 306 is manually controllable. $V_D$ may be adjusted from zero to a voltage sufficient to completely deflect the ionized portion 316 of the GCIB 128 onto the deflection plate 304 (for example a few thousand volts). When the ionized portion 316 of the GCIB 128 is deflected onto the deflection plate 304, the resulting current, $I_D$ flows through electrical lead 312 and current sensor/display 310 for indication. When $V_D$ is zero, the GCIB 128 is undeflected and travels to the workpiece 160 and the workpiece holder 162. The GCIB beam current $I_B$ is collected on the workpiece 160 and the workpiece holder 162 and flows through electrical lead 168 and current sensor/display 320 to electrical ground. $I_B$ is indicated on the current sensor/display 320. A beam gate 172 is controlled through a linkage 338 by beam gate controller 336. Beam gate controller 336 may be manual or may be electrically or mechanically timed by a preset value to open the beam gate 172 for a predetermined interval. In use, $V_D$ is set to zero, and the beam current, $I_B$, striking the workpiece holder is measured. Based on previous experience for a given GCIB process recipe, an initial irradiation time for a given process is determined based on the measured current, $T_B$. $V_D$ is increased until all measured beam current is transferred from $I_B$ to $I_D$ and $I_D$ no longer increases with increasing $V_D$. Current sensor/display 320 is only shown for purposes of the above description, and may not be used on an ANAB apparatus.

At this point a Neutral Beam 314 comprising energetic dissociated components of the initial GCIB 128 irradiates the workpiece holder 162. The beam gate 172 is then closed and the workpiece 160 placed onto the workpiece holder 162 by conventional workpiece loading means (not shown). The beam gate 172 is opened for the predetermined initial radiation time. After the irradiation interval, the workpiece may be examined and the processing time adjusted as necessary to calibrate the desired duration of Neutral Beam processing based on the measured GCIB beam current $I_B$. Following such a calibration process, additional workpieces may be processed using the calibrated exposure duration. The workpiece 160 may also be moved in two separate dimensions perpendicular to the Neutral Beam 314 by a translation device 164, to provide scanning of the Neutral Beam 314 over a larger workpiece 160 with appropriate controls for dosage per cm squared of the workpiece 160.

The Neutral Beam 314 contains a repeatable fraction of the initial energy of the accelerated GCIB 128. The remaining ionized portion 316 of the original GCIB 128 has been removed from the Neutral Beam 314 and is collected by the grounded deflection plate 304. The ionized portion 316 that is removed from the Neutral Beam 314 may include monomer ions and gas cluster ions including intermediate size gas cluster ions. Because of the monomer evaporation mechanisms due to cluster heating during the ionization process, intra-beam collisions, background gas collisions, and other causes (all of which result in erosion of clusters) the Neutral Beam substantially consists of neutral monomers, while the separated charged particles are predominately cluster ions. The separated charged beam components largely consist of cluster ions of intermediate size as well as monomer ions and perhaps some large cluster ions. Certain superior process results are obtained by processing workpieces using this Neutral Beam as recited by a variety of published patents and patent applications.

As part of the present invention, Neutral Beam 314 passes into and through particle elimination assembly 350 having a path limiter 352, an ionizer 354 and a deflector or blocker 356. The ionizer 354 may be referred to as a second ionizer component for the Neutral Beam apparatus 300. Ionizer 354 can employ a hot filament electron source or a plasma emission source to produce charging of entering particles by electron bombardment. Because the contaminating particles of concern travel at relatively low velocities and consist of large numbers of atoms, they are easy to ionize and the required ionizer can be relatively simple. Prototype ionizers 402 in the configurations shown in FIGS. 2A and 2B have employed electron sources consisting of a tensioned 0.013 cm diameter tungsten wire emitter filament 403 that is 2 cm long positioned 0.1 cm behind tungsten mesh extraction grid screens 404 biased at 175 volts positively relative to the emitter. These electron source ionizers, which are adequate for the present ionization purpose, are used to inject 10 to 20 milliamperes of ionizing electron current into a region approximately 1 cm long on the path of the neutral atom beam 314.

In order for a second electron source ionizer 402 to be able to function independently of the ANAB source primary ionizer 122, which operates at high positive potential, electrons of the second electron source ionizer 402 have to be created at, and kept within, a positive potential relative to ground. Electrons in the ionizer 402 of the particle elimination assembly 350 must remain confined such that they cannot leak backstream to the primary ionizer 122 of the ANAB source to cause overloading of the ANAB high voltage supplies. Experience has shown that even if a negatively-biased suppression electrode is present between the ANAB primary ionizer 122 at high positive potential and a particle elimination assembly ionizer 402 at ground potential, electrons escaping from the particle elimination assembly ionizer 402 are still able to find paths to the ANAB primary ionizer 122. As the solution to this problem, the second ionizer 402 of the particle elimination assembly can be surrounded by a ground shield 406 and operated at a modest positive bias of a few volts (+10 volts for example) relative to ground. An appropriate configuration is shown in FIGS. 2A and 2B. Redundant electrode plates 408 which are shown in the configurations are for the purpose of minimizing undesirable field leakage and are considered to be optional.

An essential characteristic of the second ionizer 402 is that it must be effective at ionizing particles, but it must not produce any significant ionization of the energetic neutral beam atoms themselves. None of the species which become ionized are able to continue to transport to the substrate 160 being processed. If substantial numbers of the accelerated neutral atoms were to become ionized, the result would be a reduction of the processing beam flux and a corresponding loss of system performance. Contaminating particles are easy to ionize and accelerated neutral atoms are not. Contaminating particles travel at modest velocities, often due simply to gravitational acceleration, and they are typically considered to be moving at 100 meters per second or less. Accelerated neutral beam atoms have energies of several electron volts and they consequently travel at relatively high velocities. For example, a 20 eV Ar atom travels at approximately 10,000 meters per second. A particle travelling at 100 meters per second will pass through a nominally 1 cm long ionization zone in $10^{-4}$ second; a 20 eV neutral Ar atom will pass in $10^{-6}$ second. Additionally, the cross section for ionization of a particle comprised of N atoms is $N^{2/3}$ times greater than the cross section of a single atom. For an ionizer which injects 10 mA of electrons into a 1 cm diameter×1 cm long ionization zone on the ANAB beamline, a simple calculation shows that a 30 nm diameter particle moving at 100 meters per second can be expected to be impacted by more than 50 ionizing electrons while the probability of a single electron collision with a 20 eV neutral Ar atom will be less than $1\times10^{-5}$. Particles larger than 30 nm in diameter will incur correspondingly larger numbers of ionizing impacts.

After particles have been made electrically charged in the second ionizer 402, they must either be (a) blocked from continuing on the beam path by use of a retarding field 410 or (b) deflected away from the beam path by use of a deflector assembly 420. Use of retarding field 410, as in FIG. 2A, is appropriate if all particles will be positively charged, the usual condition when electron impact ionization is utilized. If negatively charged particles as well as positively charged particles might be present, then a bipolar deflector assembly 420 as in FIG. 2B is preferred.

Figure 3:
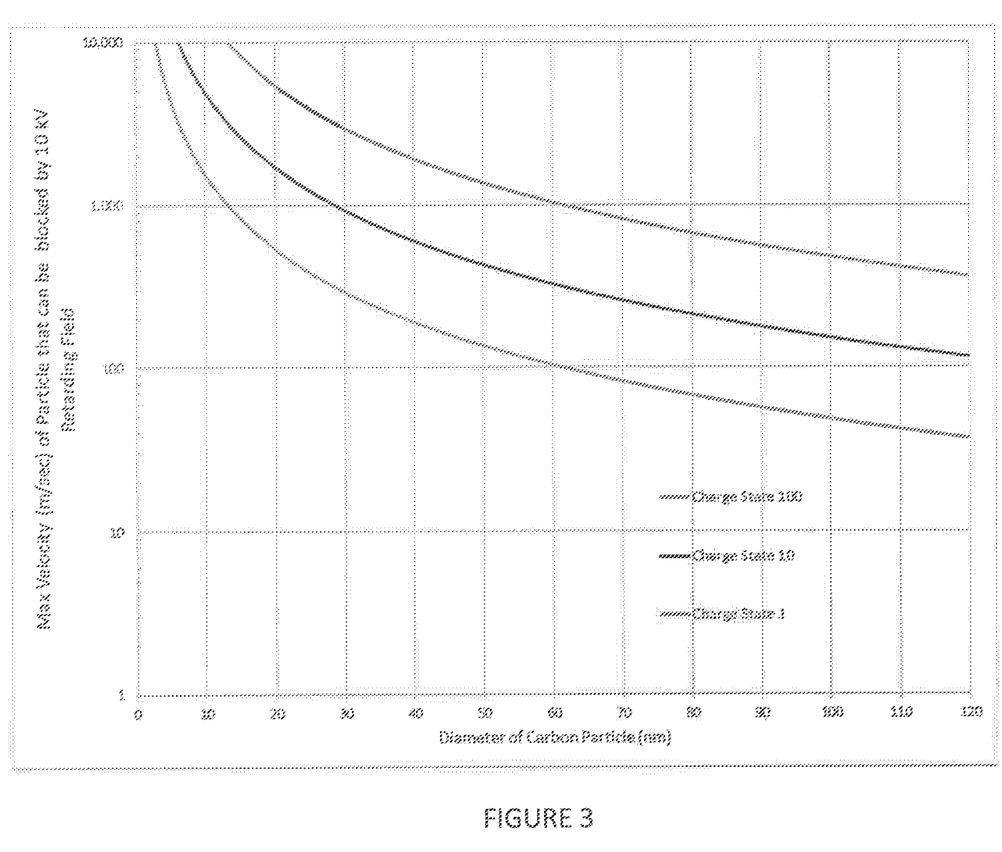
FIG. 3 shows graphs of predicted maximum velocity of any particle that can be stopped by a 10 kV retarding potential for several representative particle charge states.

In the case of blocking of positively charged particles by a retarding field 410, the necessary condition to stop any particle will be that the energy any particle would require in order to penetrate the retarding field is greater than the kinetic energy carried by that particle per the following equation (1):

$$qnV > \tfrac{1}{2}Mv^2 \qquad (1)$$

where q=charge of the electron
n=charge state of the ionized particle
V=the retarding voltage
M=mass of the particle
v=velocity of the particle It is feasible to employ blocking conditions that are impossible for any particle to overcome. As an example, consider a retarding potential of 10,000 volts. A particle with ten positive charges would have to have a kinetic energy greater than $10^5$ electron volts in order to pass through the retarding potential. In the case of a 30 nm diameter carbon particle, the particle would not be able to penetrate the retarding field unless it was travelling more than 1000 meters per second as it entered the assembly, which is an unrealistic possibility. FIG. 3 shows, for the case of carbon particles with diameters up to 120 nm and charge states of 1, 10 or 100, the velocity a particle would have to have in order to be able to penetrate beyond a 10 kV retarding voltage. In actual ANAB operation, most contamination particles are thought to have energies of only a few tens or hundreds of eV, in which case modest retarding voltages of 1000 volts or less will be sufficient.

If a deflector 420 (FIG. 2B) is used to remove ionized particles, an appropriate configuration can be a pair of opposing screen electrodes 422, 423, one biased negatively and one positively, so as to deflect positively and negatively charged species in opposite directions. While a thorough analysis of deflector operation must include details of the deflector component dimensions, a simple analysis can assume that a charged particle will not pass through the deflector without being removed if its initial kinetic energy is less than the energy that will be added to it by the electric field of the deflector. In this case, if the deflector electrodes are biased positively and negatively by equal potentials +/−B, the condition for the deflector to remove any particle can be approximated per the following equation (2):

$$qnB > \tfrac{1}{2}Mv2 \qquad (2)$$

where q=charge of the electron
n=charge state of the ionized particle
B=the voltage on each of the deflector plates
M=mass of the particle
v=velocity of the particle In this case, the analysis which was shown in FIG. 3 for blocking by a retarding field will also be roughly correct for particle removal by a bipolar deflector with potentials +10 kV and −10 kV on the deflector plates.

Figure 4A:
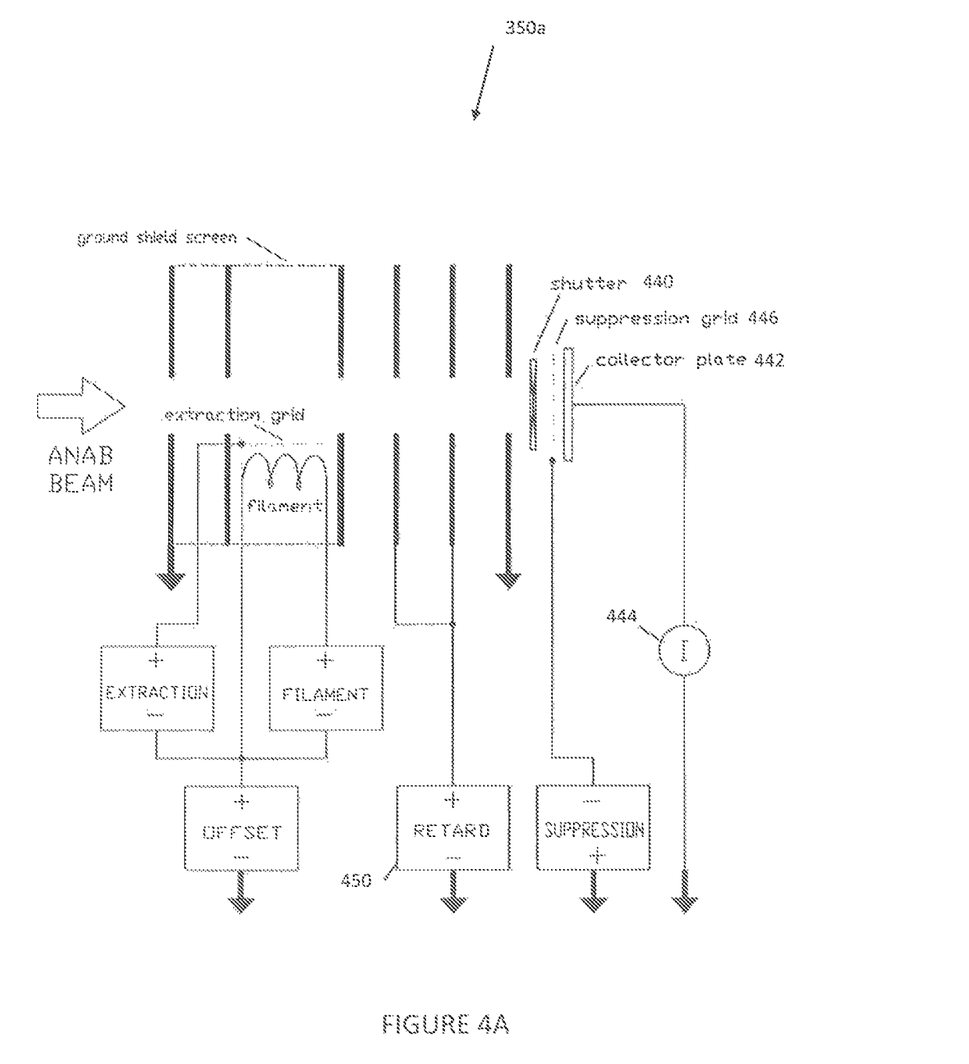
FIG. 4A shows a schematic of a configuration used for operational testing of a particle elimination assembly including a second ionizer plus retarding field electrode.
Figure 4B:
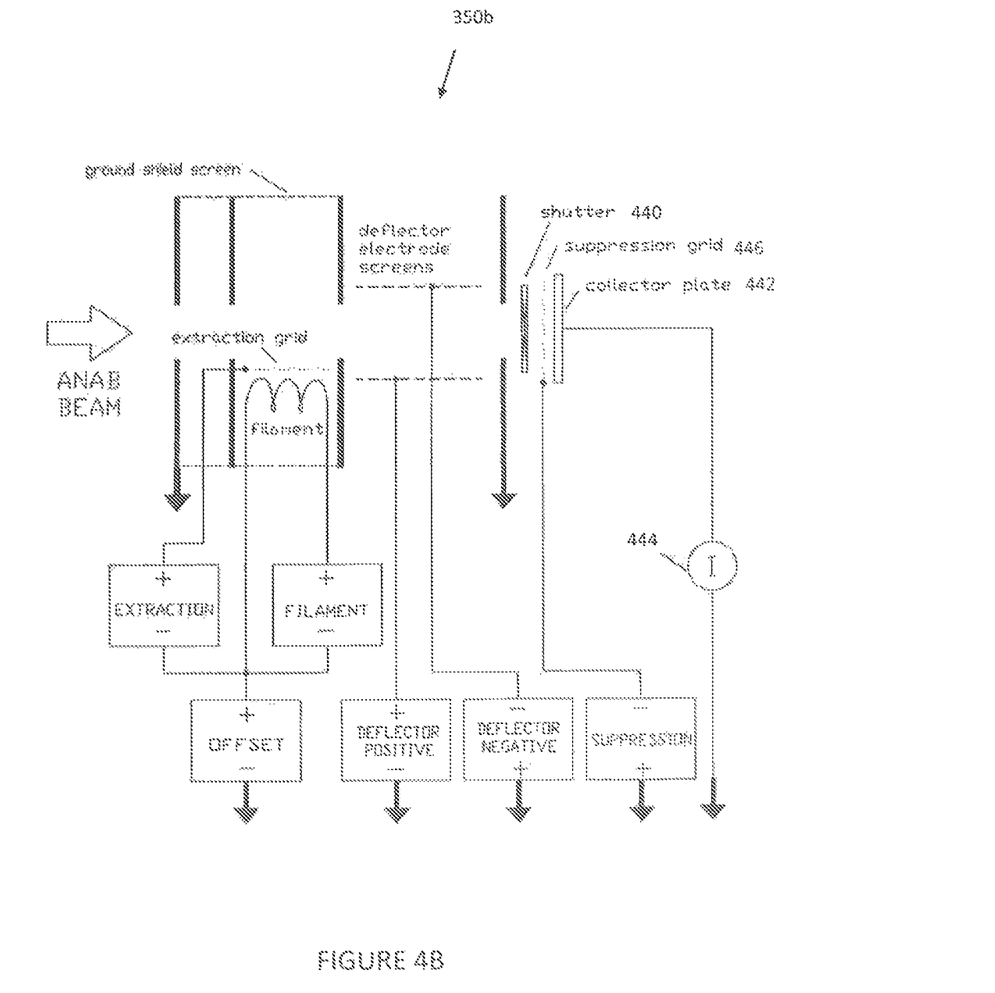
FIG. 4B shows a schematic of a configuration used for operational testing of a particle elimination assembly including a second ionizer plus deflection electrodes.

Experimental testing of prototype versions of the assemblies shown in FIG. 2A and FIG. 2B has been conducted within an ANAB system. In order to conduct the tests, prototype assemblies as shown in FIGS. 4A and 4B were mounted on the ANAB beamline and a shutter 440, a current collector plate 442, and a current meter 444 were added. For purposes to be discussed below, in each configuration of FIGS. 4A and 4I, a secondary electron suppression grid 446 was also installed directly in front of the current collector plate 442.

To confirm the performance behaviors of the second ionizer 402 and retarding field 410 or deflecting field 420 configurations, the following two operating conditions have been employed for performance tests using both configurations:

a. 200 sccm of Ar gas through the ANAB system expansion nozzle without any primary ionization as needed to create an ANAB beam, and b. standard ANAB operation with 200 sccm of Ar flow, 200V/200 mA of ionization, 30 kV acceleration and 6 kV primary ion species deflection.

Figure 5:
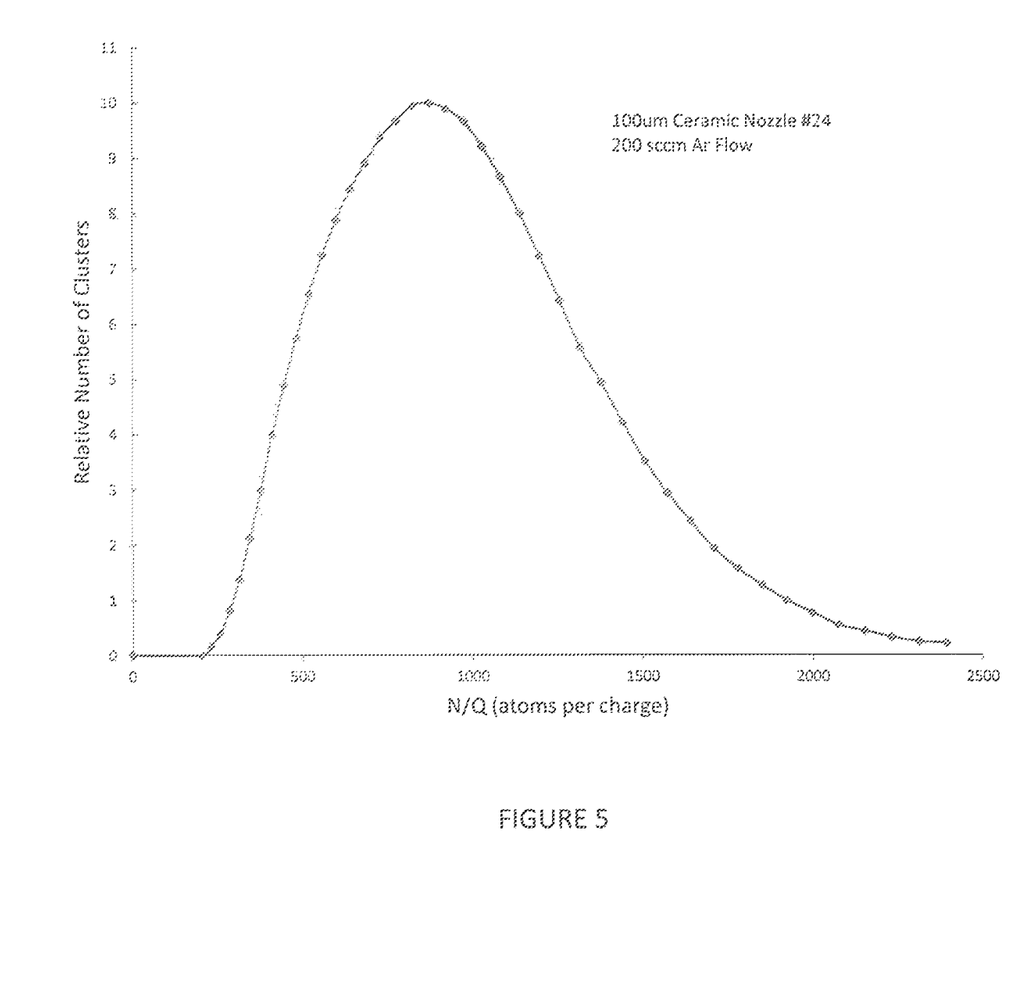
FIG. 5 shows the experimentally measured size distribution of Ar gas clusters emerging from the supersonic expansion nozzle.

In the operating conditions of case (a) of 200 sccm gas flow through the nozzle without any primary ionization (122), the Neutral Beam 314 reaching the second ionizer 402 consisted of only non-ionized Ar gas clusters, non-ionized Ar monomer atoms of background gas, and non-ionized independent Ar monomer atoms which might exist within the gas stream emerging from the expansion nozzle 110. The second ionizer 402 would be expected to be effective for ionizing low energy background gas atoms and for ionizing Ar gas clusters which carry some directed energy given to them as they emerged from the supersonic expansion nozzle 110. The second ionizer 402 would be only partially effective for ionizing individual Ar atoms emerging through the expansion nozzle at supersonic velocities. The size distribution of the Ar gas clusters produced from the nozzle under the condition employed had been previously determined by means of time-of-flight measurements on an ionized, accelerated and electrostatically chopped beam. FIG. 5 shows the cluster size distribution measured for the particular nozzle and gas flow employed for testing of the second ionizer assembly. Gas clusters are seen to have ranged in size from a few hundred atoms, to a peak at approximately 1000 atoms per cluster, and then to a low intensity distribution tail extending to several thousand atoms. It is known that the average energy of atoms within clusters emerging in flows from supersonic nozzles is of the order of 0.1 eV per atom. Consequently the directed energies of the individual clusters in the distribution of FIG. 5 would be expected to range from tens of eV for the smallest clusters to several hundreds of eV for small numbers of the largest clusters.

In the operating conditions of case (b) of normal ANAB operation at 200 sccm gas flow through the nozzle, 200V/200 mA of ionization, 30 kV acceleration and 6 kV primary deflection, Ar clusters are no longer present within the beam and the species entering the second ionizer consist only of non-ionized Ar background gas monomer atoms, non-ionized energetic ANAB neutral atoms, and possibly some residual directed non-ionized Ar atoms of the gas stream from the expansion nozzle. The second ionizer 402 can be expected to be effective for ionizing the low energy background gas monomer atoms, slightly effective for ionizing any non-ionized residual Ar atoms within the cluster stream, and almost completely ineffective for ionizing the energetic ANAB atoms due to their extremely short transit times through the ionization region.

Second Ionizer with Retarding Field Blocking

Figure 6:
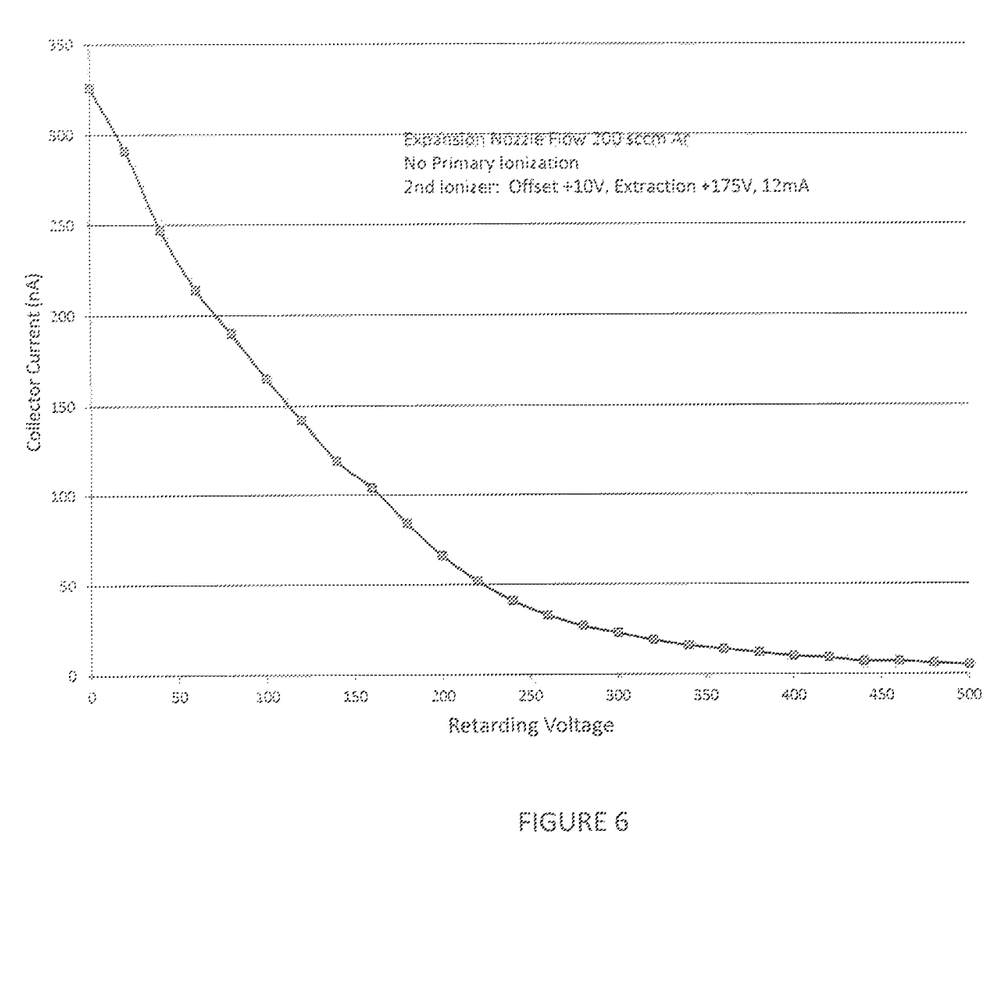
FIG. 6 is a graph of collected current versus retarding field voltage for a second ionizer with retarding electrode operating in an expansion nozzle gas flow with no primary ionization.

With reference to FIG. 4A, and for the gas flow without any primary ionization, FIG. 6 shows a plot of measured collector plate current versus retarding voltage 450 of the assembly 350a with retarding field electrode 410. Ionizer parameters were: offset +10V, extraction +175V and extraction current 12 mA. It can be seen from FIG. 6 that a retarding potential of a little more than 500 volts was required to completely block all the clusters which became ionized within the second ionizer 402. This is consistent with the observation above that a small population of largest clusters would carry directed energies of several hundreds of electron volts as they emerged from the expansion nozzle 110. It is important to realize that the Ar gas clusters emerging from the supersonic expansion nozzle 110 are in fact small particles and the results in FIG. 6 are consistent with the required blocking voltage predictions of Equation (1) above.

Figure 7:
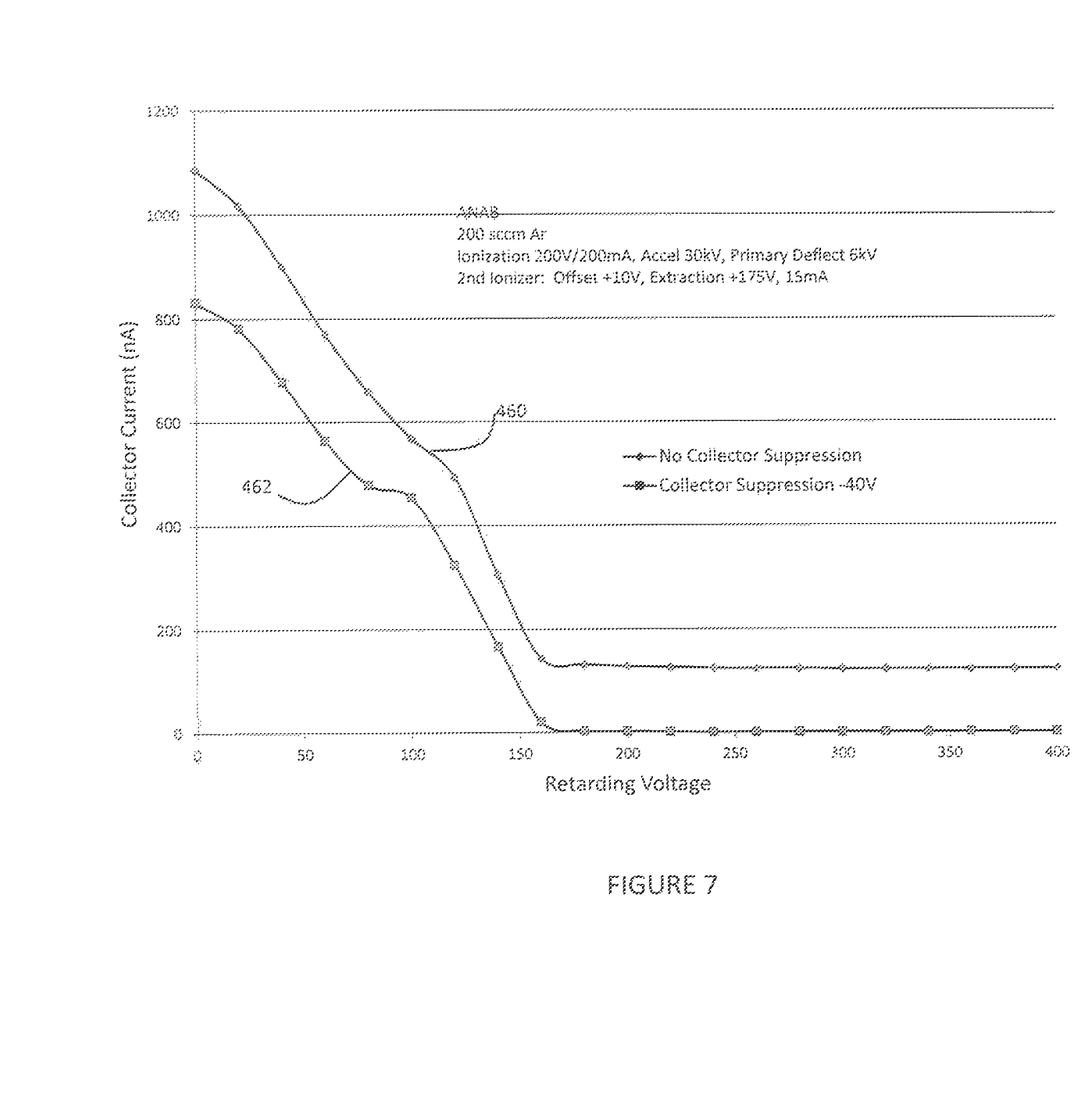
FIG. 7 is a graph of collected current versus retarding field voltage for a second ionizer with retarding electrode operating in an ANAB beam.

In the case of the second ionizer 402 and retarding field assembly 350a operating in the standard ANAB beam, FIG. 7 shows measured collector current as a function of the retarding voltage 450. Second ionizer parameters were: offset +10V, extraction +175V and extraction current 15 mA. Two plots are included in FIG. 7. The first plot 460 shows collector current measured with no voltage on the suppression grid 446 in front of the collector plate. The second plot 462 shows collector current measured with −40 volts on the suppression grid 446 in order to stop secondary electrons from leaving the current collector plate and thereby being recorded as an erroneous contribution to the arriving current. The plot 462 taken with −40 volts on the suppression grid shows that a retarding potential of approximately 170 volts was sufficient to completely block all charged species created within the second ionizer 402 from exiting the assembly and travelling to the collector plate. Essentially none of the background gas atoms ionized within the second ionizer 402 could have energies exceeding 170 volts due to being created within the extraction field region of the second ionizer and then being accelerated to ground at the collector plate.

The plot 460 in FIG. 7 taken with no voltage applied to the suppression grid shows that collector current reached a minimum at a retarding potential of approximately 170 volts, but a residual current then remained that did not decrease with further increase of the retarding potential. The residual collector current at retarding voltages higher than 170 volts seen in the FIG. 7 data taken without voltage on the suppression grid 446 in front of the collector plate 442 was secondary electron current emerging from the collector plate 442 due to impacts of the energetic ANAB neutral atoms which passed through the second ionizer without becoming ionized. This observation confirms the critically important behavior that ANAB neutral atoms remain unaffected as they pass through the second ionizer 402 assembly.

Second Ionizer with Deflector Electrodes

Figure 8:
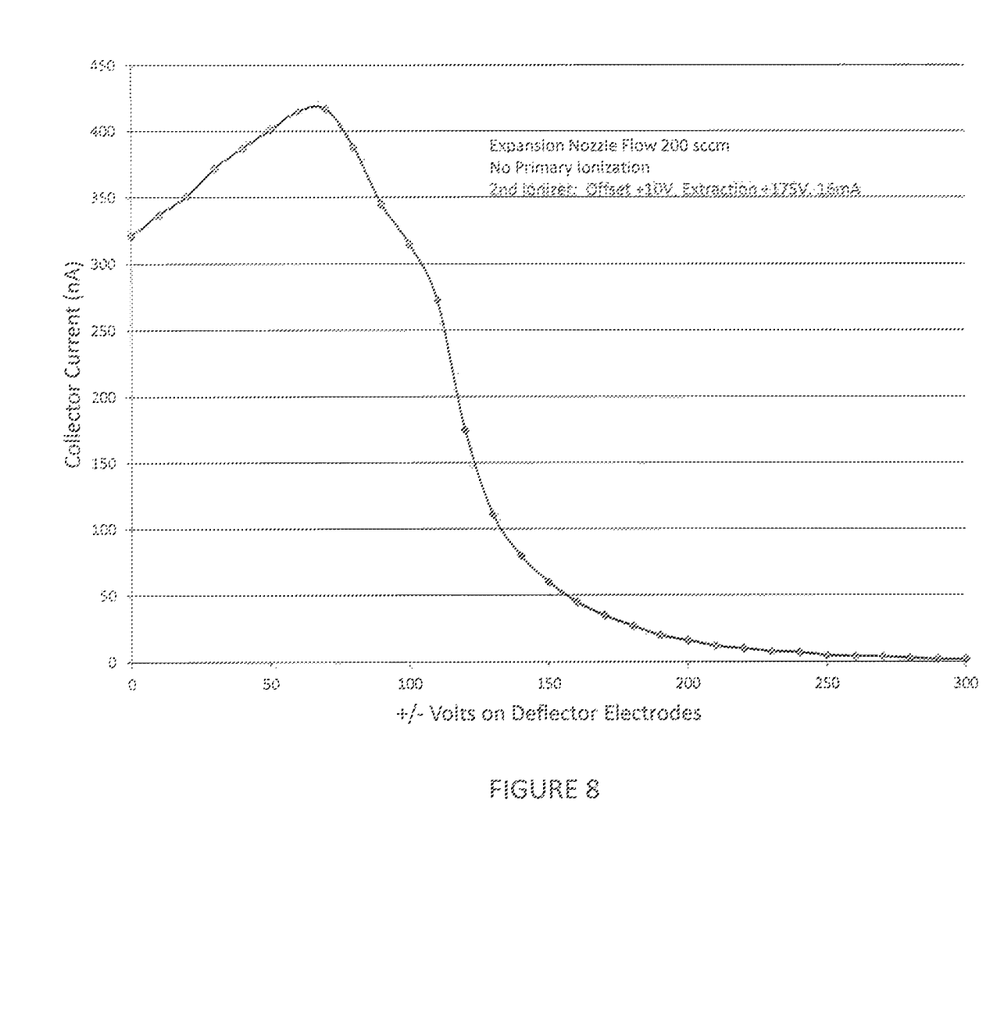
FIG. 8 is a graph of collected current versus deflector voltage for a second ionizer with deflecting electrodes operating in an expansion nozzle gas flow with no primary ionization.

With reference to FIG. 4B for the case of only nozzle gas flow without any primary ionization and the second ionizer with deflector electrodes, FIG. 8 shows collector current versus the equal positive and negative potentials applied to the deflector electrodes. Second ionizer 402 parameters were: offset +10V, extraction +175V and extraction current 16 mA. From FIG. 8 it can be seen that approximately +/−300 volts on the deflectors was required to completely prevent all charged species from reaching the collector plate. As has been discussed above, in this test the species entering the second ionizer 402 were non-ionized Ar gas clusters, non-ionized Ar monomer atoms of background gas and non-ionized residual Ar monomer atoms which might exist within the gas stream emerging from the supersonic nozzle 110. The directed energies carried by individual gas clusters as they entered the second ionizer 402 would be expected to range from tens of eV for the smallest clusters to several hundreds of eV for the largest clusters. Consequently the observation that +/−300 volts on the deflector electrodes was required to prevent any charges from reaching the current collector plate is consistent with the analytical predictions given by Equation (2).

Figure 9:
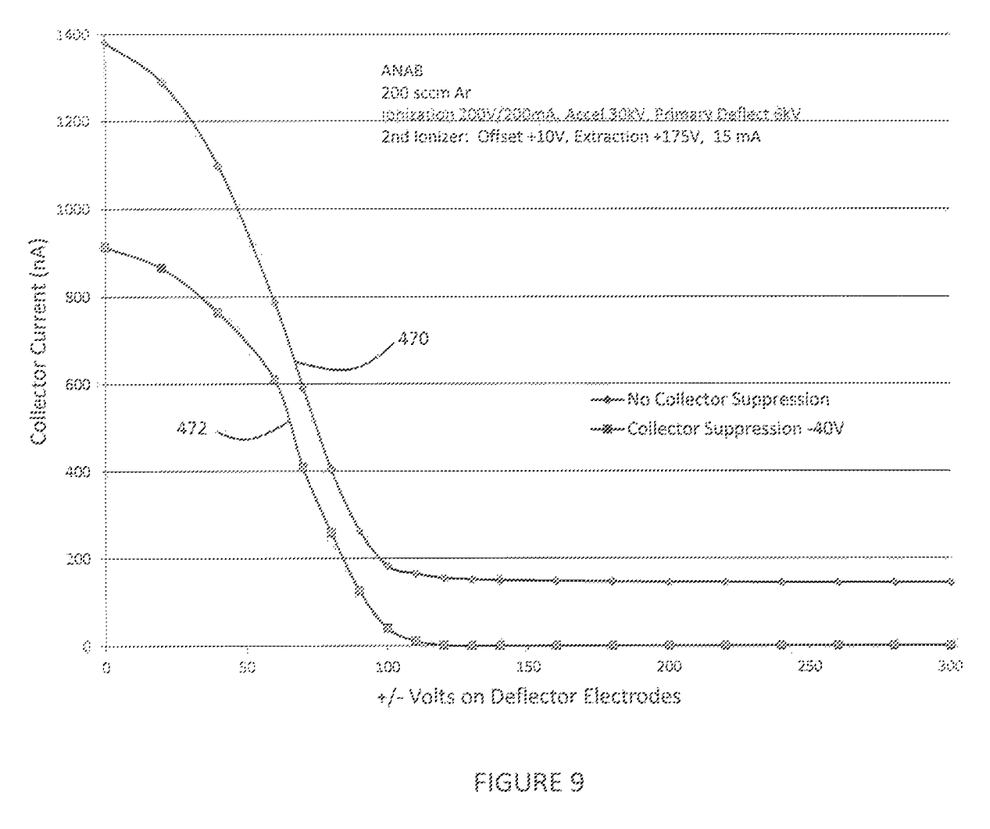
FIG. 9 is a graph of collected current versus deflector voltage for a second ionizer with deflecting electrodes operating in an ANA B beam.

In the case of the second ionizer and deflector electrodes assembly 350b operating in the standard ANAB beam, FIG. 9 shows measured collector current versus the equal +/−potentials applied to the deflector electrodes. Second ionizer parameters were: offset +10V, extraction +175V and extraction current 15 mA. Two plots are included in FIG. 9. The first plot 470 shows current measured with no voltage on the suppression grid in front of the collector plate. The second plot 472 shows current measured with −40 volts on the suppression grid for the purpose of preventing secondary electrons from leaving the collector plate and thereby appearing as an erroneous contribution to collected current. During these measurements the species entering the second ionizer 402 were non-ionized background Ar gas atoms, the energetic ANAB neutral atoms, and possibly a small number of residual non-ionized Ar monomer atoms which might remain in the gas stream emerging from the expansion nozzle 110. The plot 472 taken with −40V on the suppression grid shows that potentials of +/−170 volts on the deflector electrodes were sufficient to completely remove from the beam all the charged species created within the second ionizer 402, including the charged Ar gas clusters which would have directed energies to as high as several hundred eV. This is consistent with the prediction resulting from Equation (2) above. The plot 470 taken with the suppression grid 446 grounded shows that current at the collector plate declined to a minimum at +/−170 volts on the deflector electrodes and then failed to decline further with additional increase of the deflector potentials. The residual collector current at deflector potentials greater than +/−170 volts is recognized to be secondary electron current emerging from the collector plate due to impacts of the energetic ANAB neutral atoms which passed through the second ionizer 402 without becoming ionized. This observation again confirms the fundamentally important result that energetic ANAB neutral atoms remain unaffected as they pass through the second ionizer assembly.

In summary, tests of both prototype versions of the second ionizer particle elimination assemblies 350a, 350b successfully demonstrated the following:

1) the assemblies are able to operate without detrimentally influencing the primary ionizer used to create the ANAB beam;
2) the assemblies are effective in ionizing and eliminating species arriving at relatively low velocities and/or with large physical cross sections;
3) the assemblies do not ionize or reject the ANAB energetic neutral atoms; and
4) the performance characteristics of the assemblies are represented approximately correctly by Equation (1) and Equation (2) in the discussions above.

The second ionizer particle elimination assemblies 350a, 350b will be highly effective in ionizing and rejecting from the ANAB beam every particle 30 nm or greater in diameter, and also smaller particles comprised of one million or more atoms, without any detrimental influence upon the ANAB energetic neutral atoms themselves.

The present invention is illustratively described above in reference to the disclosed embodiments. Various modifications and changes may be made to the disclosed embodiments by persons skilled in the art without departing from the scope of the present invention as defined in the appended claims.

What is claimed is:

1. A method of accelerated neutral atom beam [ANAB] processing of target substrate surfaces, the method comprising:
   providing a contaminant particle elimination step in an ANAB process of deriving a neutral beam
      wherein the neutral beam has been subjected to a first ionization step,
      wherein the neutral beam has been accelerated under conditions subject to entraining contaminant particles in the neutral beam, and
      wherein the neutral beam comprises energetic monomers from a gas cluster ion beam [GCIB], and
   providing a step of deflecting or blocking contaminant particles in the neutral beam in an assembly for deflecting or blocking contaminant particles, wherein no paths of the neutral beam to a target substrate surface to be processed exist other than through the assembly and wherein the step of deflecting or blocking includes a second electron ionization step which is implemented without detrimentally influencing the primary ionization by employing positive offset voltages and a surrounding ground screen to prevent electrons from escaping.

2. The method of claim 1 wherein a retarding field is employed in the assembly to block ionized particles from travelling to the target substrate surface.

3. The method of claim 1 wherein an electrostatic deflector is employed in the assembly to remove ionized particles from the path to the target substrate surface.

* * * * *